United States Patent [19]

Saner

[11] 4,037,903
[45] July 26, 1977

[54] CASING

[75] Inventor: Kaspar Saner, Dubendorf, Switzerland

[73] Assignee: Wirth, Gallo and Company, Switzerland

[21] Appl. No.: 718,416

[22] Filed: Aug. 27, 1976

[30] Foreign Application Priority Data

Oct. 23, 1975  Switzerland ............... 13850/75

[51] Int. Cl.² ............ H01R 13/52; H01R 13/54; H01R 13/58

[52] U.S. Cl. ............... 339/75 R; 339/91 R; 339/94 R; 339/103 B

[58] Field of Search .......... 339/75 R, 75 M, 91 R, 339/103 R, 103 B, 94 R, 114

[56] References Cited

U.S. PATENT DOCUMENTS

| | | | |
|---|---|---|---|
| 3,156,513 | 10/1964 | Peterson et al. | 339/91 R X |
| 3,680,033 | 7/1972 | Kawai | 339/91 R X |
| 3,697,928 | 10/1972 | Hammell | 339/91 R X |
| 3,710,304 | 1/1973 | Warner et al. | 339/75 R X |

FOREIGN PATENT DOCUMENTS 951,673  3/1964  United Kingdom ............ 339/103 R

*Primary Examiner*—Roy Lake
*Assistant Examiner*—E. F. Desmond
*Attorney, Agent, or Firm*—Stevens, Davis, Miller & Mosher

[57] ABSTRACT

A casing for an electrical apparatus having a front wall and a back wall, an electrical plug on said back wall, said casing having a base, a jacket in which said apparatus is mounted, said jacket being detachably fixed to said base, a passage in said base, a set of cables through said passage, a plug socket fixed to said cables, said back wall, said jacket and said base forming a water sealed room, said plug and said plug socket being within said room when said jacket is fixed to said base.

6 Claims, 9 Drawing Figures

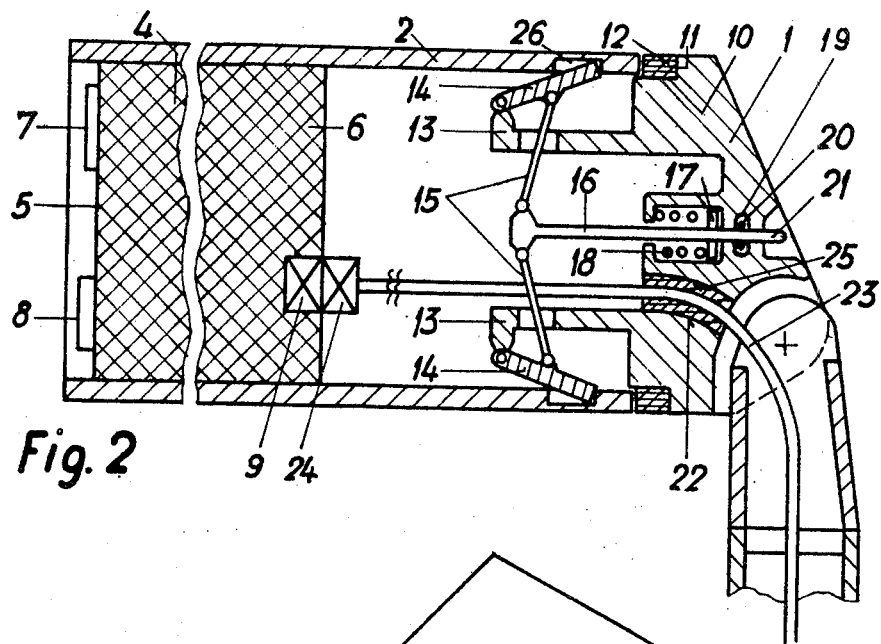
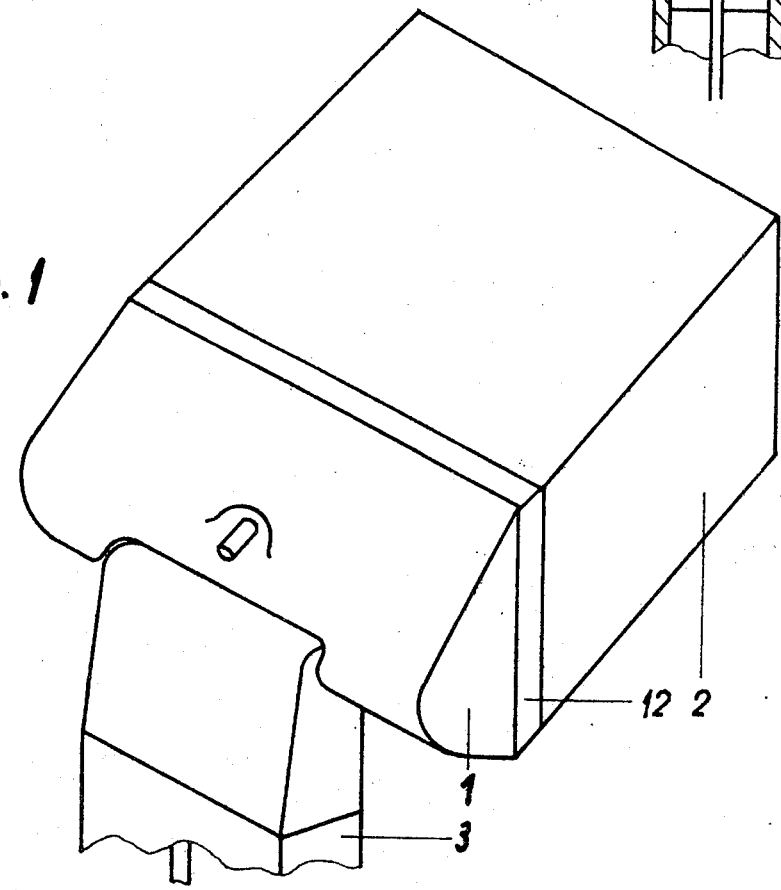

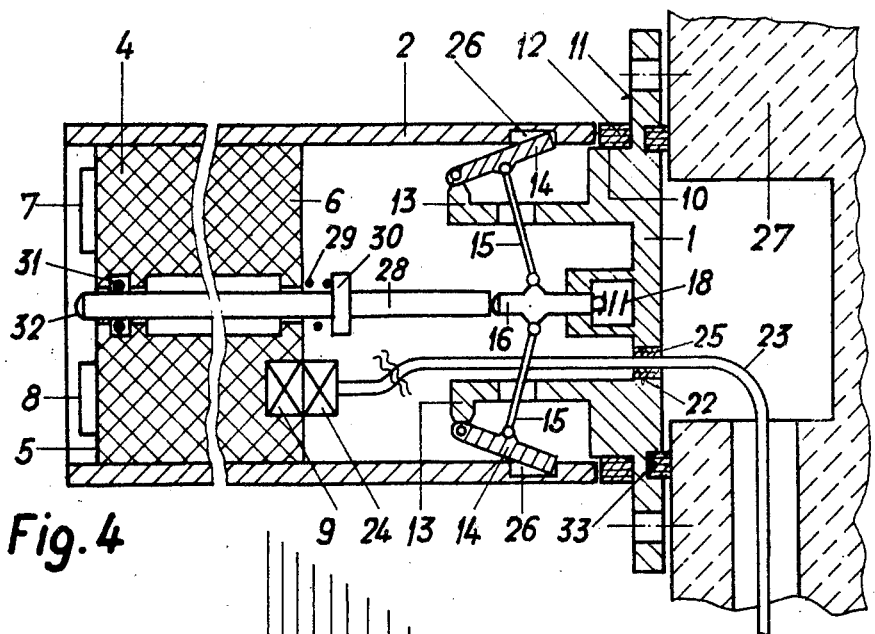
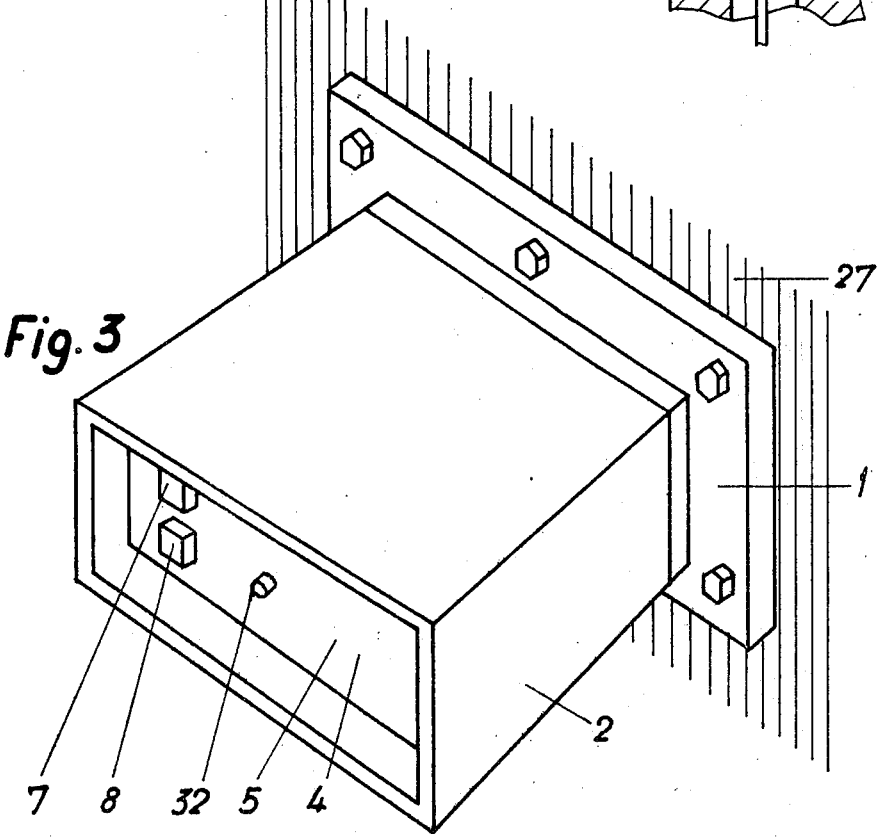

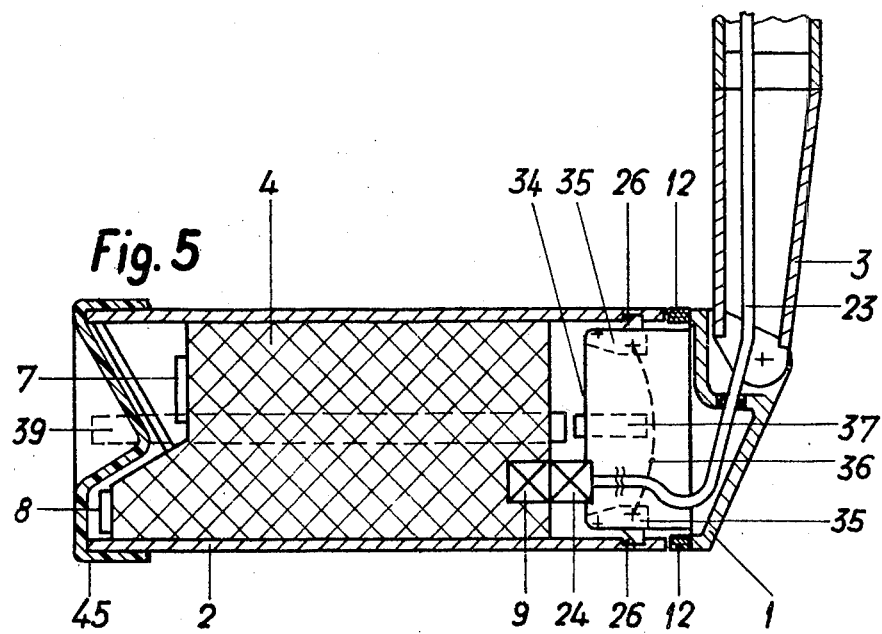
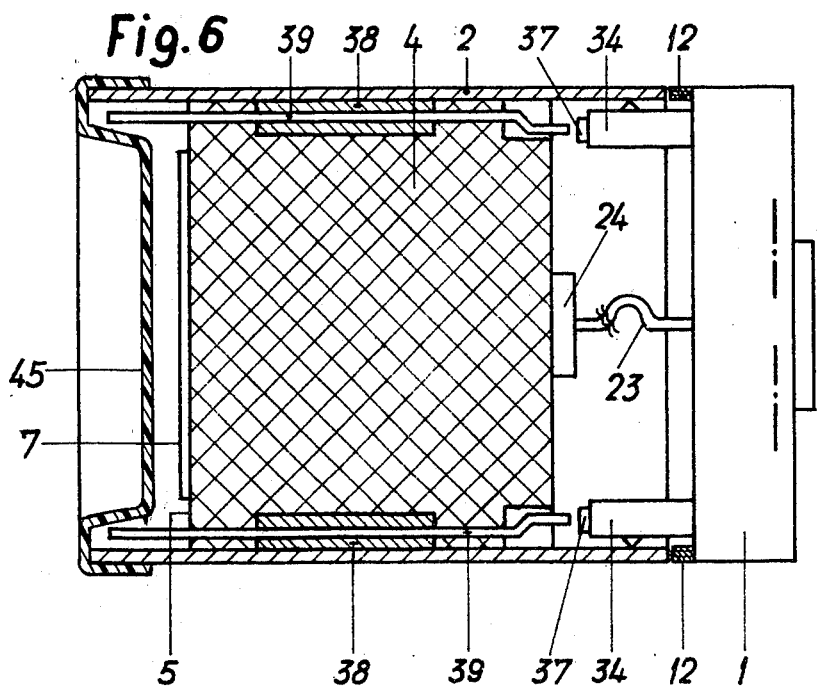

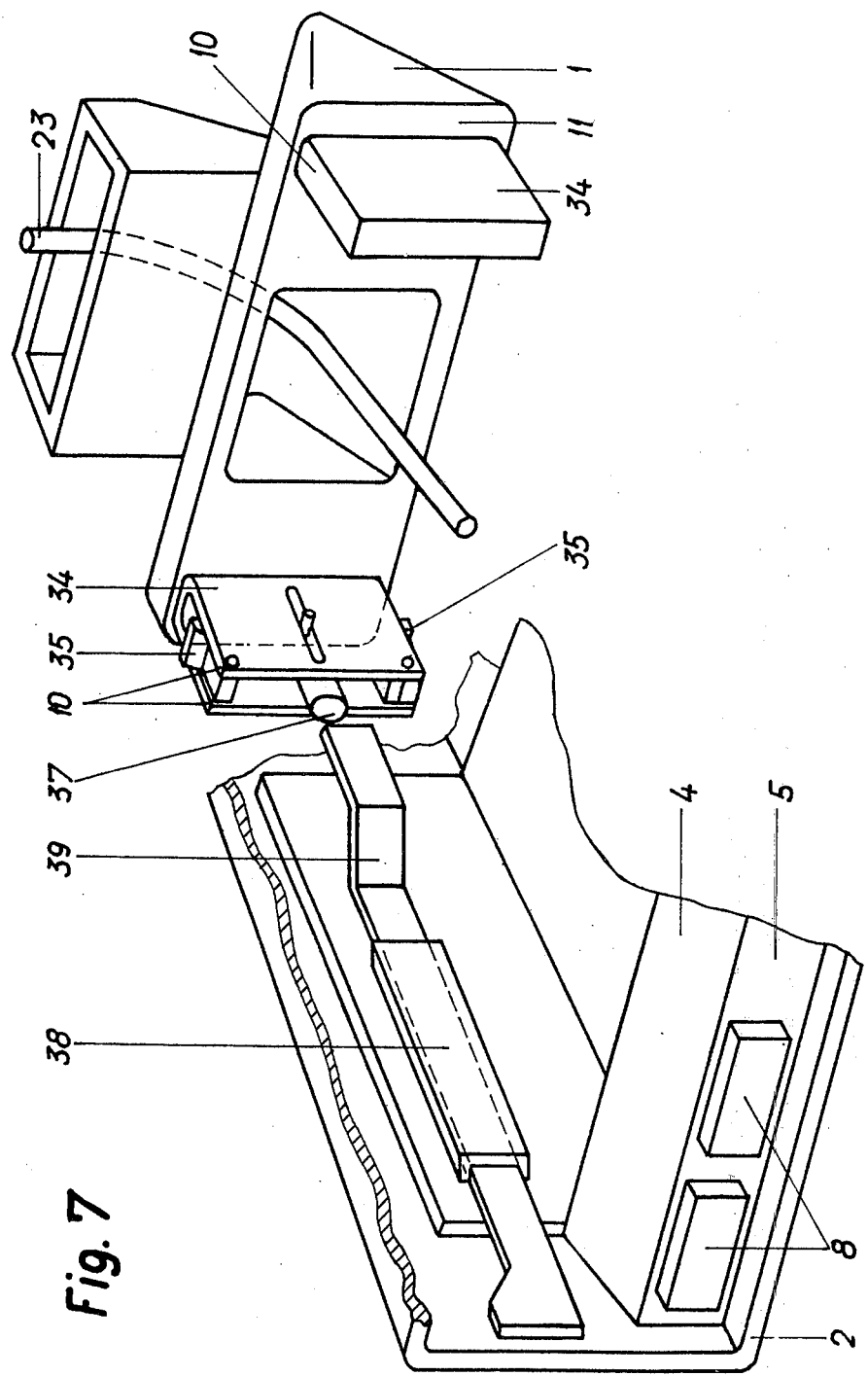

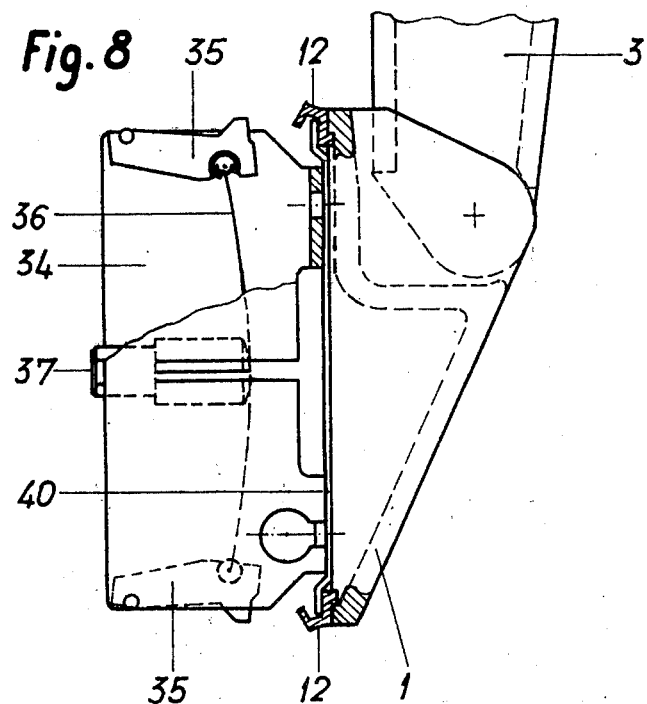
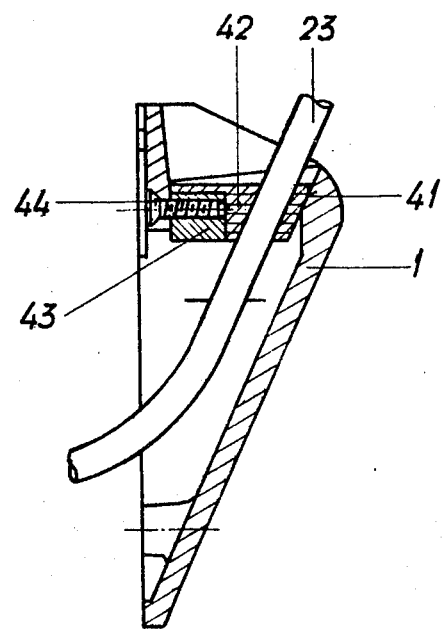

4,037,903

CASING

The invention relates to a casing for an electrical apparatus comprising a front wall and a back wall with an electrical plug. Such casings are particularly suited for control and/or display devices in complex installations like industry balances or mcahine tools. They must allow for an easy connecting of the electrical part whilst protecting against humidity.

It is an object of the invention to provide a casing in which the electrical apparatus for which it is intended can be easily introduced and extracted. The electrical contacts must be completely protected from humidity and spraying water. Furthermore, it should be possible to mount it on a bracket so that it is easily orientable.

It is another object of the invention to provide a casing for an electrical apparatus having a front wall and a back wall, an electrical plug on said back wall, said casing having a base, a jacket in which said apparatus is mounted, said jacket being detachably fixed to said base, a passage in said base, a set of cables through said passage, a plug socket fixed to said cables, said back wall, said jacket and said base forming a water sealed room, said plug and said plug socket being within said room when said jacket is fixed to said base.

Embodiments of the object of the invention are shown in the accompanying drawings.

FIG. 1 is a perspective view of a first embodiment,

FIG. 2 is a vertical cross-section through the casing of FIG. 1,

FIG. 3 is a perspective view of a second embodiment,

FIG. 4 is a vertical cross-section through the casing of FIG. 3,

FIG. 5 is a vertical cross-section of a third embodiment,

FIG. 6 is a horizontal cross-section of said third embodiment,

FIG. 7 is a partial perspective view of said third embodiment,

FIG. 8 shows at a bigger scale a part of FIG. 5,

FIG. 9 is a vertical cross-section through the parts fixing the cable.

The casing represented in FIG. 1 and 2 has a base 1 and a jacket 2. Base 1 is fixed to a bracket 3 so as to be swingable around the axis marked by a cross in FIG. 1. An electrical apparatus 4 is mounted with jacket 2 and fixed in well known manner. The cross-section profile of jacket 2 corresponds to that of apparatus 4 for which the whole casing in designed. Apparatus 4 has a front wall 5 and a back wall 6. Front wall 5 bears display tubes 7 and control knobs 8. An electrical plug 9 is fixed to back wall 6. Apparatus 4 is mounted in jacket 2 with the necessary packings (not shown) so that humidity cannot penetrate behind wall 6.

Base 1 has a shoulder 10 with a circular abuttment surface 11. A rubber packing ring 12 is mounted on shoulder 10. Fingers 14 are rotatably mounted on arms 13 of base 1. These fingers 14 are linked by means of links 15 with a rod 16 slidably mounted in base 1 and bearing a flange 17. A pressure spring 18 is mounted between base 1 and flange 17 so as to keep rod 16 in its right most position as seen in FIG. 2. In this position of rod 16, fingers 14 are swung toward the external walls of jacket 2. A packing ring 20 is mounted in a groove 19 of base 1, it is traversed by rod 16 whose end 21 protrudes outside base 1.

Base 1 has a channel 22 through which a set of cables 23 is introduced which are fixed to a plug socket 24 corresponding to plug 9. A packing 25 is disposed in channel 22. When the whole is mounted, first plug socket 24 is connected with plug 9. The set of cables 23 is long enough for that as schematically shown in FIG. 2. Then jacket 2 is mounted on shoulder 10, when it is pushed from left to right (as seen in FIG. 2) fingers 14 are swung inwards against the effect of spring 18. Jacket 2 has inside notches 26 which are placed so that fingers 14 keep jacket 2 locked in this position. Jacket 2 with apparatus 4 are then fixed to base 1.

The connection between base 1 and jacket 2 is completely sealed so that no spraying water can enter jacket 2. Plug 9 and plug socket 24 are fully protected. In order to detach jacket 2 from base 1, end 21 of rod 16 is simply pushed inwards against the effect of spring 18. Fingers 14 are swung inwards and jacket 2 with apparatus 4 can be detached from base 1.

Means for adjusting and fixing the position of base 1 with regards to bracket 3 are not shown. Instead of a spring 18 elastic bearings with a resetting force could be used for fingers 14.

The embodiment according to FIG. 3, 4 is similar to that of FIG. 1, 2. Base 1 is fixed to a wall 27. The set of cables 23 is placed within this wall. Rod 16 is rather short and held by spring 18 in its left most position (as seen in FIG. 4). A second rod 28 is slidably mounted in apparatus 4. A weaker spring 29 is mounted between wall 6 of apparatus 4 and a flange 30 of rod 28, so that the latter is kept in contact with rod 16. The end 32 protrudes through a pushing ring 31 outside front wall 5, so jacket 2 can be detached from base 1 by pushing end 32. A packing 33 is foreseen between base 1 and wall 27.

In the third embodiment shown in FIGS. 5-9 two U-shaped brackets 34 are fixed to base 1. In each of them two hooks 35 are rotatably mounted. A leaf spring 36 is mounted between them so as to urge them outwards. In each bracket 34 a bolt 37 is slidably mounted. When jacket 2 with apparatus 4 is shifted into position on base 1, hooks 35 fall into notches 26.

Apparatus 4 has two guides 38 in each of which a flat rod 39 is slidably mounted. They can be operated from the front side so as to move bolts 37 against the effect of leaf springs 36. Hooks 35 are thereby swung inwards and jacket 2 with apparatus 4 can be detached from base 1.

A rubber packing 12 is fixed to base 1 by means of a frame 40. Base 1 has a hopper-like opening 41 for the set of cables 23 (FIG. 9). A rubber stopper 42 having a form mating that of opening 41 is fixed to the set of cables 23, it bears a vulcanized plate 43. By means of a single screw 44 it is possible to pull stopper 42 into opening 41 and to retain it there. A cap 45 in transparent and elastic material can be put over the front part of jacket 2 (FIG. 5, 6). The control knobs 8 are thereby well protected and can be operated. Such a cap could be used with the other embodiments as well.

Bracket 3 (FIG. 5) could be fixed to a movable arm, which can have various orientations. Such an arm could be fixed to a wall, to a vertical socle fixed to the ground and/or to the ceiling.

I claim:

1. A casing for an electrical apparatus having a front wall and a back wall, an electrical plug on said back wall, said casing having a base, a jacket in which said apparatus is mounted, stop spring means between said base and said jacket, said means comprising a rod slidably mounted in said base, a spring loading said rods and fingers rotatably mounted in said base and operatively connected with said rod, said rod having an end protruding outside said base, said jacket being thereby detachably fixed to said base, a passage in said base, a set of cables through said passage, a plug socket fixed to said cables, said back wall, said jacket and said base forming a water sealed room, said plug and said plug socket being within said room when said jacket is fixed to said base.

2. A casing for an electrical apparatus having a front wall and a back wall, an electrical plug on said back wall; said casing having a base, a jacket in which said apparatus is mounted, stop spring means between said base and said jacket, said means comprising a rod slidably mounted in said base, a spring loading said rod and fingers rotatably mounted in said base and operatively connected with said rod, said rod having an end protruding outside said front wall, said jacket being thereby detachably fixed to said base, a passage in said base, a set of cables through said passage, a plug socket fixed to said cables, said back wall, said jacket and said base forming a water sealed room, said plug and said plug socket being within said room when said jacket is fixed to said base.

3. A casing for an electrical apparatus having a front wall and a back wall, an electrical plug on said back wall, said casing having a base, a jacket in which said apparatus is mounted, stop spring means between said base and said jacket, said jacket being detachably connected to said base by said stop spring means, two lateral guides in said apparatus, two rods slidably mounted in said guides and having one end protruding outside said front wall, their other end being operatively connected with said stop spring means, a passage in said base, a set of cables through said passage, a plug socket fixed to said cables, said back wall, said jacket and said base forming a water sealed room, said plug and said plug socket being within said room when said jacket is fixed to said base.

4. A casing for an electrical apparatus having a front wall and a back wall, an electrical plug on said back wall, said casing having a base, a jacket in which said apparatus is mounted, stop spring means between said base and said jacket, said stop spring means comprising two U-shaped brackets having each two guiding surfaces for said jacket, two rotatably mounted hooks, a leaf spring fixed to said hooks and a slidably mounted bolt operatively connected with said leaf spring, said jacket being detachably connected to said base by said stop spring means, a passage in said base, a set of cables through said passage, a plug socket fixed to said cables, said back wall, said jacket and said base forming a water sealed room, said plug and said plug socket being within said room when said jacket is fixed to said base.

5. A casing for an electrical apparatus having a front wall and a back wall, an electrical plug on said back wall, said casing having a base, a jacket in which said apparatus is mounted, said jacket being detachably fixed to said base, a hopper-like opening in said base, a set of cables through said opening, a rubber stopper fixed to said cables, said stopper having a form mating with that of said hopper-like opening, a vulcanized plate fixed to said stopper, a plug socket fixed to said cables, said back wall, said jacket and said base forming a water sealed room, said plug and said plug socket being within said room when said jacket is fixed to said base.

6. A casing for an electrical apparatus having a front wall and a back wall, an electrical plug on said back wall, said casing having a base, a jacket in which said apparatus is mounted, said jacket being detachably fixed to said base, a passage in said base, a set of cables through said passage, a plug socket fixed to said cables, said back wall, said jacket and said base forming a water sealed room, said plug and said plug socket being within said room when said jacket is fixed to said base, a hub of elastic, transparent material detachably fixed to said jacket.

* * * * *